(12) United States Patent
Schmidt et al.

(10) Patent No.: US 8,923,011 B2
(45) Date of Patent: Dec. 30, 2014

(54) INTERCONNECT BOARD

(75) Inventors: Lothar Schmidt, Erbach (DE); Christoph Kutscher, Ulm (DE)

(73) Assignee: Kathrein-Werke KG, Rosenheim (DE)

( * ) Notice: Subject to any disclaimer, the term of this patent is extended or adjusted under 35 U.S.C. 154(b) by 386 days.

(21) Appl. No.: 13/290,223

(22) Filed: Nov. 7, 2011

(65) Prior Publication Data

US 2013/0114229 A1 May 9, 2013

(51) Int. Cl.
*H05K 1/14* (2006.01)
*H05K 1/02* (2006.01)

(52) U.S. Cl.
CPC ............ *H05K 1/0286* (2013.01); *H05K 1/142* (2013.01); *H05K 2201/09781* (2013.01)
USPC ............ 361/785; 361/729; 361/736; 361/792

(58) Field of Classification Search
CPC .................. H05K 1/14–1/148; H05K 3/0052; H05K 7/02; H05K 7/023; H05K 7/1092; H05K 7/1465; H05K 2201/09781; H05K 2201/10515; H05K 2201/10689; H05K 2201/09751
USPC ......... 361/728, 729, 733, 735, 736, 785, 786, 361/789, 790, 792
See application file for complete search history.

(56) References Cited

U.S. PATENT DOCUMENTS

| | | | |
|---|---|---|---|
| 7,209,987 B1 | 4/2007 | Schneider et al. | |
| 7,425,684 B2 * | 9/2008 | Ta | 174/255 |
| 7,660,923 B2 | 2/2010 | Schneider et al. | |
| 7,800,919 B2 * | 9/2010 | Crabtree et al. | 361/803 |
| 7,986,280 B2 | 7/2011 | Semonov | |
| 7,994,984 B2 | 8/2011 | Inoue et al. | |
| 8,339,804 B2 * | 12/2012 | Crabtree et al. | 361/803 |
| 2004/0094328 A1 * | 5/2004 | Fjelstad et al. | 174/251 |
| 2005/0035825 A1 | 2/2005 | Carson | |
| 2005/0156295 A1 * | 7/2005 | Corisis et al. | 257/668 |

FOREIGN PATENT DOCUMENTS

| | | |
|---|---|---|
| FR | 2957747 | 9/2011 |
| JP | 04085985 | 3/1992 |

OTHER PUBLICATIONS

International Preliminary Report issued in PCT/EP12/72061 on May 13, 2014.

* cited by examiner

*Primary Examiner* — Hoa C Nguyen
(74) *Attorney, Agent, or Firm* — Stephen H. Eland; Dann, Dorfman, Herrell & Skillman

(57) ABSTRACT

A combination of an interconnect board and a module board for connecting a plurality of electronic modules to a processing unit is described. The interconnect board comprises a plurality of interconnect data lines connected between a plurality of interconnect board input terminals and interconnect board output terminals. The module board comprises at least one electronic module connected to a module connection input terminal, a plurality of module board data lines connected between a plurality of module board input terminals and a plurality of module board output terminals, and an unconnected module board output terminal. A first one of the interconnect board output terminals is connectable to the module connection input terminal, and the unconnected module board output terminal is connectable to one of the interconnect board input terminals.

4 Claims, 3 Drawing Sheets

INTERCONNECT BOARD

FIELD OF THE INVENTION

The field of the invention relates to a combination of an interconnect board and a module board for connecting a plurality of electronic modules to a processing unit.

BACKGROUND OF THE INVENTION

The use of mobile communications networks has increased over the last decade. Operators of the mobile communications networks have increased the number of base stations in order to meet an increased demand for service by users of the mobile communications networks. The operators of the mobile communications network wish to reduce the running costs of the base station. One option to do this is to implement a radio system as an antenna-embedded radio forming an active antenna array. Many of the components of the antenna-embedded radio may be implemented on one or more chips.

Nowadays active antenna arrays are used in the field of mobile communications systems in order to reduce power transmitted to a handset of a customer and thereby increase the efficiency of the base transceiver station, i.e. the radio station. The radio station typically comprises a plurality of antenna elements, i.e. an antenna array adapted for transceiving a payload signal. Typically the radio station comprises a plurality of transmit paths and receive paths. Each of the transmit paths and receive paths are terminated by one of the antenna elements. The plurality of the antenna elements used in the radio station typically allows steering of a beam transmitted by the antenna array. The steering of the beam includes but is not limited to at least one of: detection of direction of arrival (DOA), beam forming, down tilting and beam diversity. These techniques of beam steering are well known in the art.

The active antenna array or active antenna system is typically mounted on a mast or tower. The active antenna array is coupled to the base transceiver station (BTS) by means of a fibre optics cable and a power cable. The base transceiver station is coupled to a fixed line telecommunications network operated by one or more operators.

Equipment at the base of the mast as well as the active antenna array mounted on the mast is configured to transmit and receive radio signal within limits set by communication standards.

The code sharing and time division strategies as well as the beam steering rely on the radio station and the active antenna array to transmit and receive within limits set by communication standards. The communications standards typically provide a plurality of channels or frequency bands useable for an uplink communication from the handset to the radio station as well as for a downlink communication from the radio station to the subscriber device.

For example, the communication standard "Global System for Mobile Communications (GSM)" for mobile communications uses different frequencies in different regions. In North America, GSM operates on the primary mobile communication bands 850 MHz and 1900 MHz. In Europe, Middle East and Asia most of the providers use 900 MHz and 1800 MHz bands.

As technology evolves, the operators have expressed a desire for an active antenna product that is able to utilise the existing base-station investments, in addition to providing a new system/band. For example, in the roll-out of long term evolution (LTE) at 700 MHz (US) or 800 MHz (EU), the operators would like to deploy a single antenna at the mast-head which could transmit the existing 900 MHz (EU) or 850 MHz (US) GSM signals, using equipment at the base of the mast, as well as providing active antenna functionality for the new LTE installation.

FIG. 1 shows an example of an active antenna system 10 as known in the prior art. The active antenna system 10 comprises a power supply unit 12, a central processing unit 20 plus a calibration feedback radio 25 and a plurality of transceiver units 50. In one aspect of the invention sixteen transceiver units 50 are present. It would be also possible to have four, eight or twenty transceiver units 50, but the number of transceiver units is not limiting of the invention.

Each one of the transceiver units 50 requires individual bi-directional high-speed digital data cables 22 to the central processing unit 20 as well as an individual analog RF coaxial line 23 to the calibration feedback radio 25. Furthermore, all of the transceiver units 50 require an individual select line (at lower speed digital) from the central processing unit 20. All of the transceiver units 50 have at least two shared power supply lines from the power supply unit 12. Currently data cables 22 in the form of jumper leads make the connection between the central processing unit 20 and the individual transceiver unit 50. These data cables 22 have a known length, but experience shows that these known lengths can slightly vary from an active antenna system 10 to active antenna system 10. This slight variation in length of the data cables 22 between the central processing unit 20 and the transceiver units 50 due to the slight variation of length in the data cables 22 means that the phases of the signals are slightly different in each of the active antenna systems 10. As a result, the signal paths need to be individually calibrated.

Furthermore, the large number of data cables 22 (one per transceiver unit 50) and also the number of power cables mean that the connection between the central processing unit and the transceiver unit 50 need to be strictly quality controlled to avoid the wrong one of the transceiver unit 50 being connected to the central processing unit 20.

The large number of data cables 22 and the power supply lines 13 add to the weight of the active antenna system 10, as well as increase in the manufacturing complexity.

SUMMARY OF THE INVENTION

This disclosure teaches a combination of an interconnect board and a module board for connecting a plurality of electronic modules to a processing unit. The interconnect board comprises a plurality of interconnect data lines connected between a plurality of interconnect board input terminals and interconnect board output terminals. The module board comprises at least one electronic module connected to a module connection input terminal, a plurality of module board data lines connected between a plurality of module board input terminals and a plurality of module board output terminals, and an unconnected module board output terminal. A first one of the interconnect board output terminals is connectable to the module connection input terminal, and the unconnected module board output terminal is connectable to one of the interconnect board input terminals.

In one aspect of the combination, an nth one of the plurality of interconnect data lines is connected through a corresponding one of the interconnect board output terminal to the nth one of the plurality of module board data lines through a corresponding one of the plurality of module board input terminals.

An nth one of the plurality of module board data lines is connected though a corresponding one of the module board output terminals to the (n−1)th one of the plurality of interconnect board data lines through a corresponding one of the plurality of interconnect board input terminals. In this manner the interconnect data lines jump or skip a position between module boards.

In a further aspect of the invention, an interconnect board comprises a first board having one or more electronic modules and a second board having at least a plurality of data lines or a plurality of power lines. One of the plurality of data lines or the plurality of power lines is connected to at least one of the one or more electronic modules. At least one sealant is arranged between the first board and the second board and proximate to at least one of the connected one of the one or more electronic modules. This enables shielding of the data lines or the power lines.

DETAILED DESCRIPTION OF THE INVENTION

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
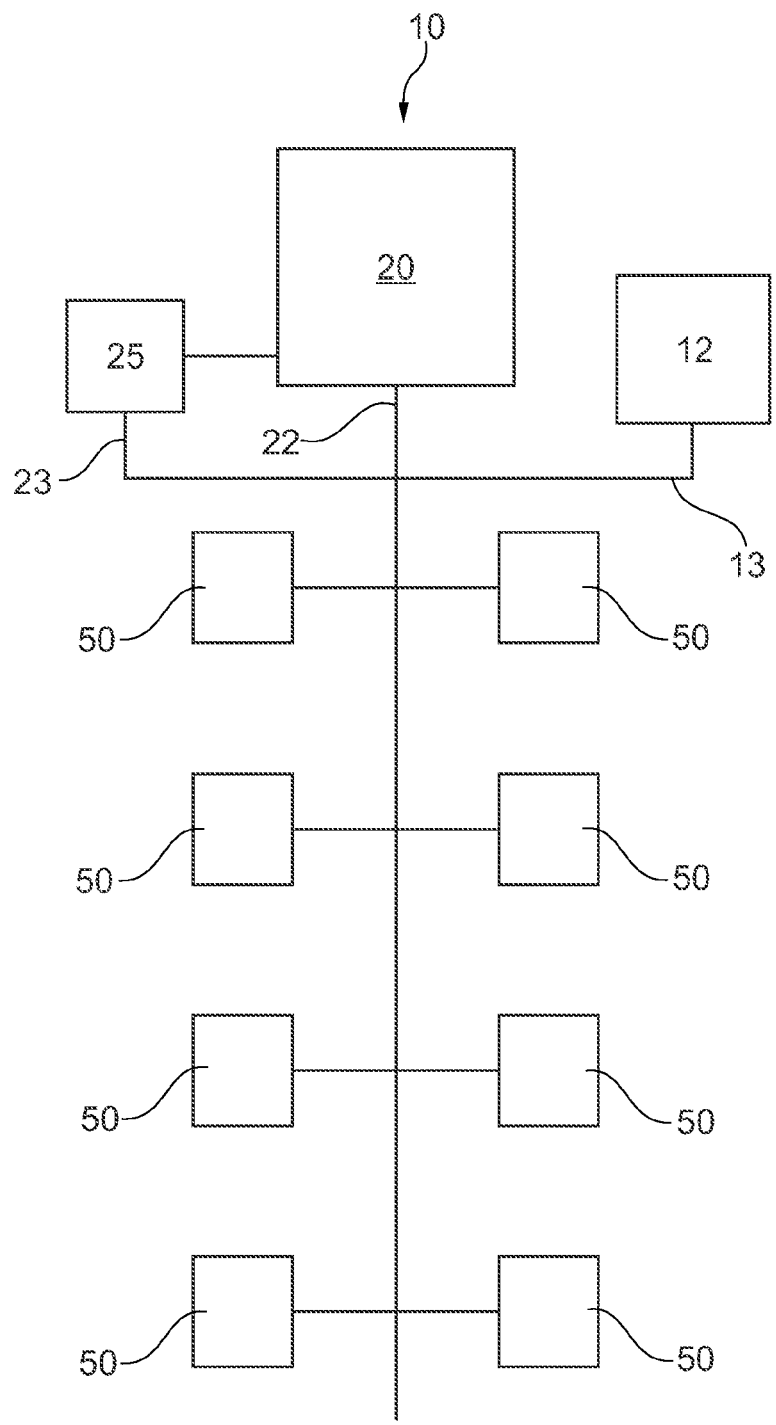
FIG. 1 shows an overview of a prior art active antenna system.
Figure 2:
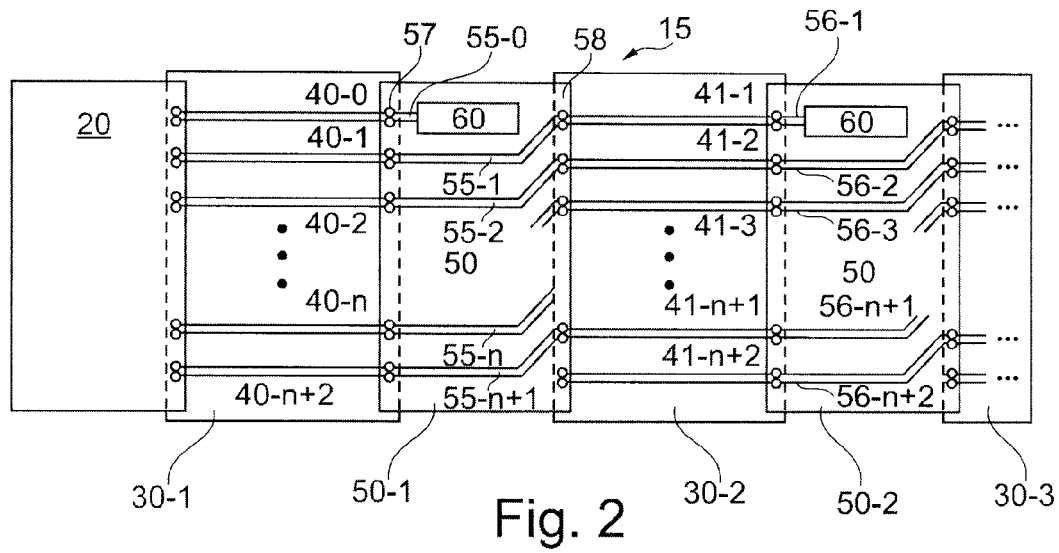
FIG. 2 shows an active antenna system according to one aspect of the invention.

FIG. 2 shows one aspect of the interconnect system 15 of this disclosure. A central processing unit 20 is connected to at least one transceiver unit 50. Eight of the transceiver units 50 are shown in this aspect of the invention (in FIG. 1), but this is not limiting. The transceiver units 50 are connected between each other and the central processing unit 20 by means of an interconnect board 30. FIG. 2 shows a first interconnect board 30-1 connected between a first transceiver unit 50-1 and the central processing unit 20. A second interconnect board 30-2 is connected between the first transceiver unit 50-1 and the second transceiver unit 50-2. FIG. 2 furthermore shows a third interconnect board 30-3 that will be connected to further ones of the transceiver unit 50 (which are not shown on this figure for sake of clarity).

Figure 4:
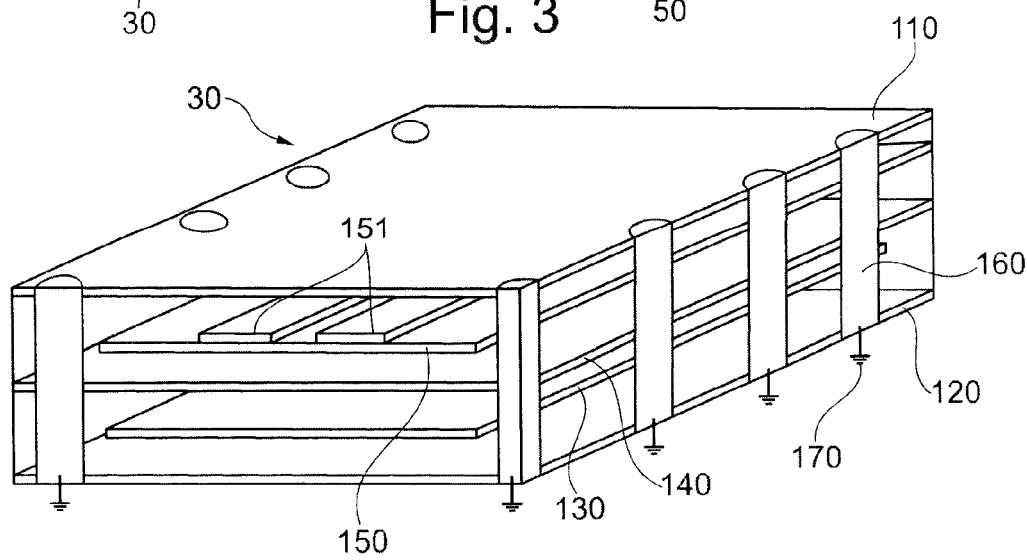
FIG. 4 shows a three dimensional view of the interconnect board.

The interconnect boards 30 (shown as the first interconnect board 30-1, the second interconnect board 30-2 and the third interconnect board 30-3 on FIG. 2) have a plurality of interconnect data lines 40-0 to 40-$n$+1 or 41-1 to 41-$n$+2 (collectively called 40 and 41). The interconnect data lines 40 and 41 are situated within the interconnect boards 30, as is shown in FIG. 4. The interconnect data lines 40, 41 are manufactured from a conducting metal, such as but not limited to copper. It will be seen from FIG. 2 that all of the interconnect boards 30 are identically manufactured. In other words the first interconnect board 30-1 is totally exchangeable with the second interconnect board 30-2 and vice versa. Similar other ones of the interconnect boards 30 are interchangeable. It will be understood that the length of the interconnect data lines 40, 41 are substantially similar on each of the interconnect boards 30.

In the aspect of the invention of FIG. 2, the first transceiver board 50-1 has n+1 transceiver data lines 55-1 to 55-$n$+1 from an input 57 to an output 58 plus a terminated data line 55-0. The second interconnect board 30-2 also has n+1 interconnect data lines 56-2 to 55-$n$+2 plus the terminated data line 56-1. It will be appreciated that in this aspect of the invention the number of interconnect data lines 55 and 56 is equal on each of the transceiver boards 50.

Figure 3:
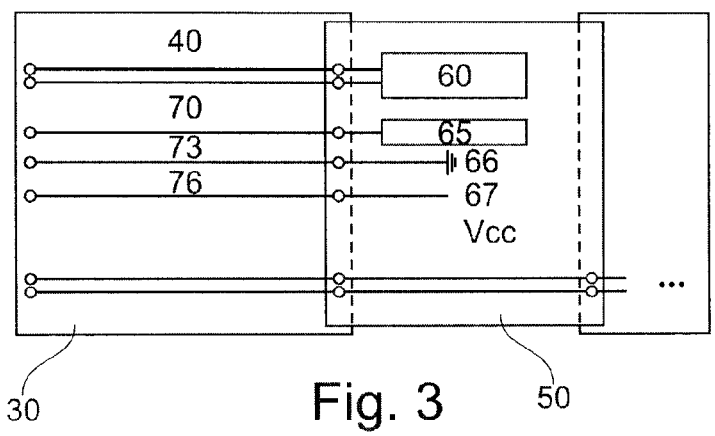
FIG. 3 shows an interconnect board with a transceiver unit.

The interconnect boards 30 may in addition to the interconnect data lines 40 which are adapted to carry high speed digital data, have an input signal line 70, a delay measurement line 73, a reference line 76 and self diagnosis lines 79. These lines are shown in FIG. 3. It will be appreciated that there will be one input signal line 70 for each one of the transceiver boards 50 and generally one delay measurement line 73, one reference line 76 and two self-diagnosis lines 79 for each one of the transceiver boards 50.

The transceiver units 50 have a radio processor 60 connected to the transceiver data line 55-0 on the first transceiver unit 50-1 and to the transceiver data line 56-1 on the second transceiver unit 50-2, as is shown in FIG. 2. The transceiver unit 50 may also have an amplifier 65, a ground 66 and a connection to a supply voltage 67 (as shown in FIG. 3).

It will be seen from FIG. 2 that a zeroth one of the interconnect data lines 40-0 is connected to the radio processor 60 through the input terminals 57. The zeroth interconnect data line 40-0 therefore carries the data signals to the radio processor 60 on the first transceiver unit 50-1.

A first interconnect data line 40-1 is connected to a first transceiver data line 55-1 on the first transceiver board 50-1. The first transceiver data line 55-1 is connected to an output terminal 58 and is not in this aspect to the invention, connected to the transceiver unit 50 or any other electronic component mounted on the first transceiver unit 50. Similarly, a second interconnect data line 40-2 is connected to a second transceiver data line 55-2 through the input terminal 57. The second transceiver data line 55-2 is connected to the output terminal 58 of the first transceiver unit 50-1. All of the other interconnect data lines 40-2 . . . 40-$n$, 40-$n$+1 are similarly connected to the transceiver data lines 55-2, . . . 55-$n$, 55-$n$+1 through the input terminals 57. All of the transceiver data lines 55-1 to 55-$n$ are connected to the output terminals 58. However, the zeroth transceiver data line 55-0 connected to the zeroth interconnect data line 40-0 is only connected to the radio processor 60 and is not connected to an output terminal 58.

Turning now to the second interconnect board 30-2, it can be seen that all of the second interconnect data lines 41-1 to 41-$n$+1 are connected to the output terminals 58 of the first transceiver unit 50. However, the last one of the interconnect data lines 40-$n$+2 (shown as the bottom line on FIG. 2) has no connection to the first transceiver unit 50-1 through an output terminal 58, because the output terminal 58 of the first transceiver unit 50-1 is not connected to any one of the transceiver data lines 55 on the first transceiver unit 50-1. It will be noted that the first transceiver data line 55-1 is connected to the interconnect data line 40-1 and similarly the second transceiver data line 55-2 is connected to the first interconnect data line 40-2. Similarly the (n+1)th transceiver data line 55-$n$+1 will be connected to the (n+1)th interconnect data line 41-$n$+1. In other words at the transition between the transceiver board 50 and the interconnect board 30 the data lines are translated by or "skip" one place.

It can be similarly seen that the interconnect data line 41-1 of the second interconnect board 30-2 is connected to the radio processor 60 on the second transceiver unit 50-2 through the transceiver data line 56-1. In other words the transceiver data line 55-1 on the first transceiver board 30-1 is connected through the interconnect data line 41-1 to the transceiver data line 56-1 on the second transceiver board 30-2. In a similar manner to the transceiver data lines 55 on the first transceiving unit 50-1, all of the other transceiver data lines 55-1 to 55-$n$+1 from the first transceiver unit 30-1 are connected to corresponding ones of the interconnect data lines 41-2 to 41-$n$+2 on the second interconnect board 30-2 and thence to the transceiver data lines 56-1 to 56-$n$+2. It will be observed that there is no translation or "skipping" of data lines at the transition from the interconnect board 30 to the transceiver board 50. The transceiver data lines 56-2 to 56-$n$+2 of the second transceiver unit 50-2 are connected to a third interconnect board 30-3 by a translation or skip, as discussed above in connection with the first transceiver unit 50-1.

It will be seen from this design that as more transceiver units 50 are connected in series with other ones of the transceiver units using the interconnect board 30, each one of the transceiver data lines 55 carrying signals will be reduced by one so that the bottom ones of the transceiver lines 55 on the transceiver board 50 carry no signal. The design of the transceiver board 55 is in each case identical. In other words, each one of the transceiver units can be manufactured in the same manner, with a little bit of extra real estate employed for unused transceiver data lines 55. This may seem a waste of space, but is more efficient than using data cables as has been known in the past.

Each one of the interconnect boards 30 is also constructed identically. Again, as one proceeds down the series, some of the interconnect data lines 40 remain unused, i.e. are carrying no data signals. Again, this may seem a waste of real estate, but the advantages in reducing errors and simplifying manufacture overcomes the disadvantages due to the addition of real estate.

The input signal line 70, the delay measurement line 73, the reference line 76 and the self-diagnosis lines 79 will be arranged in a similar way to the transceiver data lines 55 so that they are translated by one position, as explained above.

FIG. 4 shows a perspective view of the interconnect board 30. The interconnect board 30 comprises an upper shielded plane 110 and a lower shielded plane 120. Between the upper shielded plane 110 and the lower shielded plane 120 are placed a shielded power plane 130 and an additional ground plane 140 for inter-layer shielding. There can be further power planes, if required. Another interconnect layer 150 includes a plurality of interconnect data lines 151 (of which only two are shown in FIG. 4 for simplicity). A plurality of shielding vias 160 connected to ground 170 are placed around the edges of the interconnect board.

Figure 5:
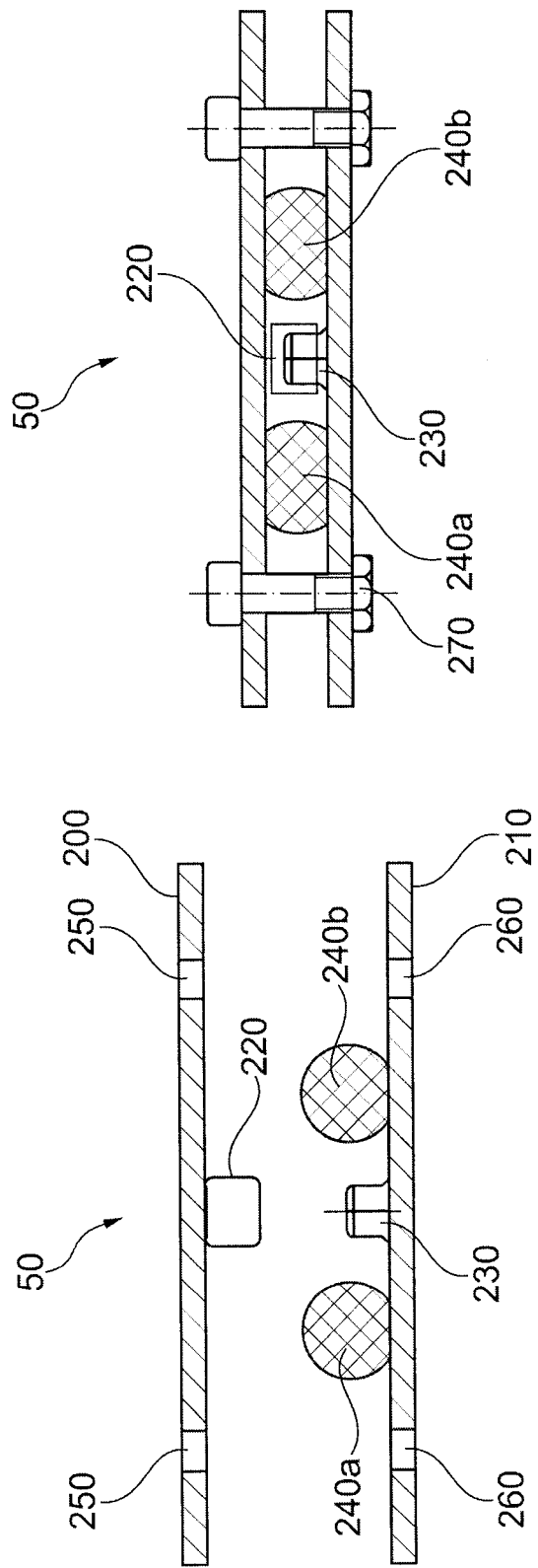
FIG. 5 shows a cross-sectional view of a module board.

FIG. 5 shows a cross-sectional view of the transceiver board 50 in an open position (left hand side) and a closed position (right hand side). The transceiver board 50 comprises a module board 200 that has an electric terminal 220 connected to an electronic module (not shown) in this example a radio module (including the radio processor 60), mounted on its upper surface. A corresponding terminal 230 connected to the transceiver data lines 55 is mounted on an upper surface of a printed circuit board 210. It will be appreciated that the terminal 230 could be connected to multiple ones of the transceiver data lines 55 or there could be plurality of terminals. A first sealant 240$a$ and a second sealant 240$b$ are mounted on the upper surface of the printed circuit board 210 around the terminals 230 and the transceiver data lines 55 on the printed circuit board 210. The first sealant 240$a$ and the second sealant 240$b$ are made of a compressible material with electromagnetic shielding properties. Examples of such compressible materials include, but are not limited to, expanded polytetrafluoroethylene, polyester and polypropylene.

The module board 200 and the printed circuit board 210 further include holes 250 and 260 for fixation devices 270.

The right hand side of FIG. 5 shows the module board 200 in a closed position. It will be seen in FIG. 5 that the terminal 230 matches with the terminal 220, as is known in the art. The first sealant 240$a$ and the second sealant 240$b$ are compressed and environmentally and electromagnetically shield the transceiver data lines 55 on the printed circuit board 210 and the electronic module board 200. It would be seen that this aspect of the disclosure requires no sealant around the outside of the transceiver unit 50.

While various embodiments of the present invention have been described above, it should be understood that they have been presented by way of example, and not limitation. It will be apparent to persons skilled in the relevant arts that various changes in form and detail can be made therein without departing from the scope of the invention.

| Reference Numerals | |
|---|---|
| 10 | Active Antenna System |
| 12 | Power Supply Unit |
| 13 | Power Supply Lines |
| 15 | Interconnect System |
| 20 | Central Processing Unit |
| 22 | Data Cables |
| 23 | RF Coaxial Line |
| 25 | Calibration Feedback Radio |
| 30 | Interconnect Board |
| 40 | Interconnect Data Lines |
| 41 | Interconnect Data Lines |
| 50 | Transceiver Units |
| 55 | Transceiver Data Lines |
| 56 | Transceiver Data Lines |
| 57 | Input Terminals |
| 58 | Output Terminals |
| 60 | Radio Processor |
| 65 | Amplifier |
| 66 | Ground |
| 67 | Supply Voltage |
| 70 | Input Signal |
| 73 | Delay Measurement Line |
| 76 | Reference Line |
| 79 | Self Diagnosis Lines |
| 110 | Upper Shielded Plane |
| 120 | Lower Shielded Plane |
| 130 | Power Plane |
| 140 | Additional Ground Plane |
| 150 | Interconnect Layer |
| 151 | Interconnect Data Lines |
| 160 | Shielding Vias |
| 170 | Ground |
| 200 | Module Board |
| 210 | Printed Circuit Board |
| 220 | Terminal |
| 230 | Terminal |
| 240a, b | Sealant |
| 250, 260 | Holes |
| 270 | Fixation devices |

The invention claimed is:

1. A first combination of an interconnect board and a transceiver board for connecting at least one radio processor to a processing unit:
    the interconnect board comprising a plurality of interconnect data lines connected between a plurality of interconnect board input terminals and a plurality of interconnect board output terminals; and
    the transceiver board comprising:
    at least one radio processor connected to a first transceiver board input terminal, wherein a first one of the interconnect board output terminals is connectable to the first transceiver board input terminal:

a plurality of transceiver board data lines connected between a plurality of transceiver board input terminals and a plurality of transceiver board output terminals, and an unconnected transceiver board output terminal; and wherein the unconnected transceiver board output terminal is connectable to one of the interconnect board input terminals of a second interconnect board of a second combination comprising the second interconnect board and a second transceiver board.

2. The first combination of claim 1, wherein an nth one of the plurality of interconnect data lines is connected through a corresponding one of the interconnect board output terminal to the nth one of the plurality of transceiver board data lines through a corresponding one of the plurality of transceiver board input terminals.

3. The first combination of claim 1 or 2, wherein an nth one of the plurality of transceiver board data lines is connectable through a corresponding one of the transceiver board output terminals to the (n-1)th one of the plurality of interconnect board data lines of a second interconnect board of the second combination through a corresponding one of the plurality of interconnect board input terminals.

4. The first combination of any one of claims 1 to 3, further comprising at least one of a power line, a reference line, a delay measurement line, or a self-diagnostic line.

* * * * *